United States Patent
Nakamura et al.

(10) Patent No.: US 6,229,507 B1
(45) Date of Patent: *May 8, 2001

(54) THIN TYPE CABLE MODEM AND STAND FOR MOUNTING THE SAME

(75) Inventors: Masahiro Nakamura, Yao; Hiroshi Kinemura, Nara, both of (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/080,463

(22) Filed: May 19, 1998

(30) Foreign Application Priority Data

May 28, 1997 (JP) .................................................. 9-138059

(51) Int. Cl.[7] ...................................................... G09G 3/32
(52) U.S. Cl. ...................... 345/82; 345/905; 340/815.45; 361/687; 361/688; 361/690
(58) Field of Search ............................ 345/82, 903, 905; 340/815.45, 815.42; 361/687, 688, 690

(56) References Cited

U.S. PATENT DOCUMENTS

| | | |
|---|---|---|
| 5,067,785 | 11/1991 | Schirbl et al. . |
| 5,151,679 * | 9/1992 | Dimmick .................. 340/815.45 |
| 5,214,621 | 5/1993 | Maggelet et al. . |
| 5,481,440 * | 1/1996 | Oldham et al. ............ 340/815.45 |
| 5,623,392 * | 4/1997 | Ma ............................ 345/905 |
| 5,638,052 * | 6/1997 | Furuya et al. ............. 345/82 |
| 5,760,754 * | 6/1998 | Amero, Jr. et al. ........ 345/82 |
| 5,781,411 * | 7/1998 | Feenstra ................... 361/704 |

FOREIGN PATENT DOCUMENTS

| | | |
|---|---|---|
| 419689 A1 | 9/1989 | (EP) . |
| 2-120876 U | 9/1990 | (JP) . |
| 2-140584 U | 11/1990 | (JP) . |
| 5191061 | 7/1993 | (JP) . |
| 5-266643 | 10/1993 | (JP) . |
| 6-84487 U | 12/1994 | (JP) . |

* cited by examiner

Primary Examiner—Bipin Shalwala
Assistant Examiner—Vincent E. Kovalick

(57) ABSTRACT

A high reliability cable modem is provided, which is superior in assembling workability, heat radiation, mounting stability. The cable modem includes a circuit board which is a substantially single board on which a front end section, a logic circuit section and an LED display section are mounted; and a housing which covers the circuit board and which has a front face, a rear face, a left side face, a right side face, a top face and a bottom face. The cable modem is provided with a plurality of symbol display for indicating an operational state of the LED display section in the front face of the housing, a plurality of exhaust holes for radiating heat generated from the front end section and the logic circuit section mounted on the circuit board in the top face of the housing, and a plurality of inlet holes for taking outside air into an interior of the housing in the bottom face of the housing. The front section is mounted on the circuit board at a position near the exhaust holes.

9 Claims, 9 Drawing Sheets

Fig. 2B
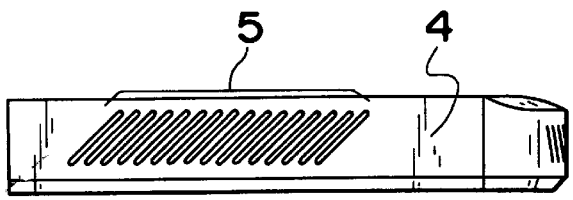
Fig. 2E  Fig. 2C  Fig. 2A
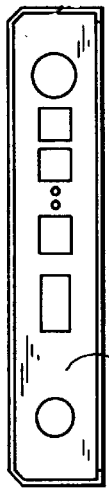 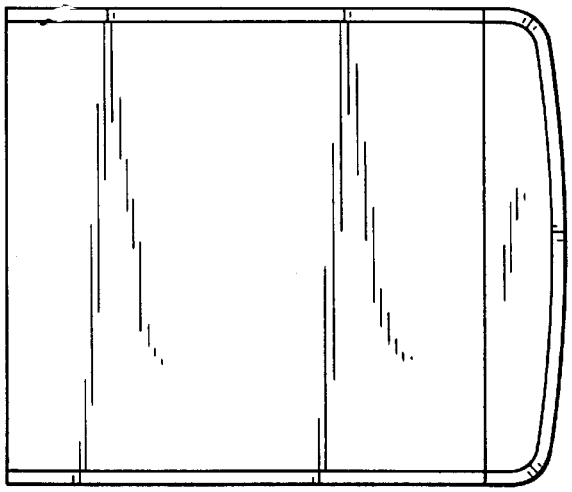 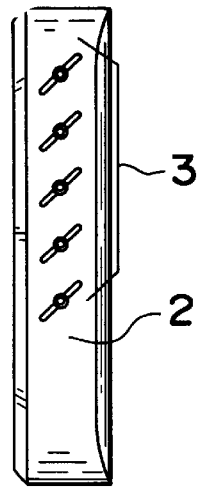
Fig. 2D
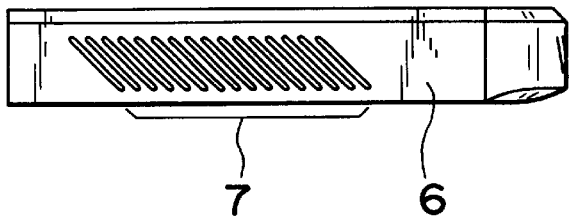

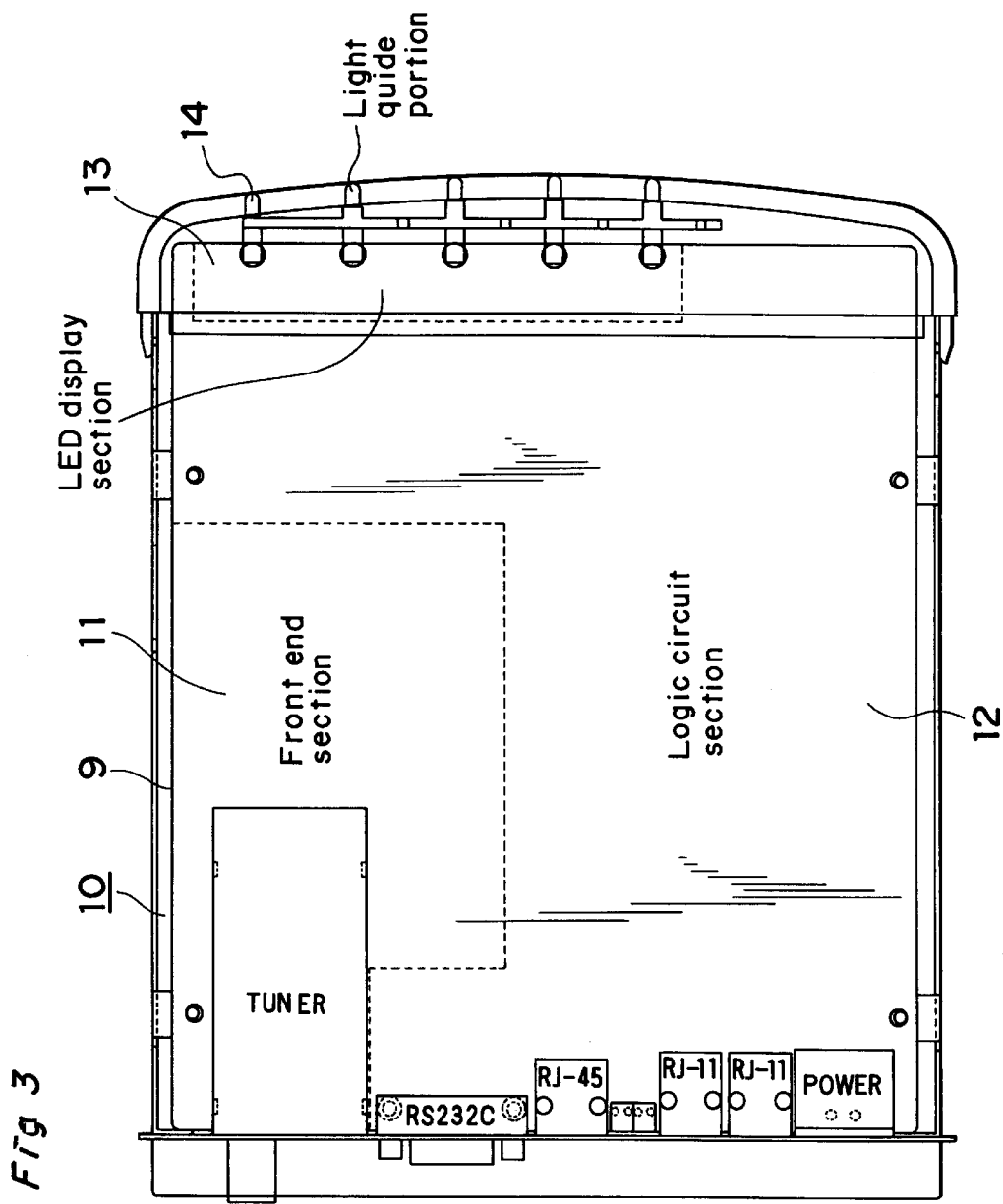

THIN TYPE CABLE MODEM AND STAND FOR MOUNTING THE SAME

BACKGROUND OF THE INVENTION

The present invention relates to a cable modem, as well as a stand for mounting the cable modem thereon, which is to be used as an interface for connecting a CATV (Cable Television) line and a personal computer to each other.

The cable modem has been playing an important role in recent years as an interface for high-speed data communications between CATV line and home or business equipment. This cable modem is equipped with an interface function of converting encoded transmission information into reception signals for personal computers. FIG. 10 shows a schematic view of a prior art example of the cable modem system. In this system, Internet 101, personal computer communication 102 or various types of information 103 is transmitted via servers 201, 202 or via a server 203 other than the CATV station (e.g., a server provided within a company), and in relay of a router 204 and further through an information encoding process by a cable modem encoder 205, to each home or company or the like 300. This encoded information, which could not be received as it is by personal computers, is subjected to signal transformation by a cable modem 301 so as to be receivable by a personal computer 302.

In the cable modem of the prior art example shown in FIG. 10, commonly, logic IC or other logic circuit components are mounted on one board, while a front end section and circuit components for the driving of LED lamp display are mounted on the other board, which means that the cable modem would be comprised of totally two circuit boards. For the mounting of the LED (Light Emitting Diode) lamp, it would be necessary to insert the LED lamp by hand, and after hand soldering, to cut off excess lead wires and further position the LED lamp so that a front end section of the LED lamp is set to a center position of a front panel opening. Besides, since much heat is generated by these logic circuit and front end sections with the cable modem in operation, it has been the case that the cable modem is fabricated through steps of inserting a metal plate for heat radiation between the two boards, mounting the circuit board structure with the metal plate inserted, in which the two boards and the metal plate have been connected to each other by screws, to a metallic chassis having a generally U-shaped cross section, and further housing the chassis in a box type cabinet.

Such a cable modem, as shown above, would take much time in assembly and inevitably involve increased outside dimensions of the cabinet, occupying a considerable space when installed on a desk, and besides the cable modem would be heavy in unit weight so as to be inconvenient to carry. Further, when the cable modem, which is normally positioned horizontally, is positioned vertically for saving space, it would be unstable, being prone to tilt. Furthermore, as another problem, when the cable modem is of smaller size and thin type design, use environmental temperatures of the circuit components would be exceeded due to temperature increase in the interior of the cabinet, causing malfunction

SUMMARY OF THE INVENTION

Therefore, an object of the present invention is to provide a high reliability cable modem which can be designed for thinner thickness and lighter weight as compared with the prior art, and which is superior in assembling workability, heat radiation, mounting stability and the like.

In order to achieve the aforementioned object, there is provided a thin type cable modem comprising: a circuit board which is a substantially single board on which at least a front end section, a logic circuit section and an LED display section are mounted; and a housing which covers the circuit board and which has a front face, a rear face, a left side face, a right side face, a top face and a bottom face, wherein a plurality of symbol displays for indicating an operational state of the LED display section are provided in the front face of the housing, and a plurality of exhaust holes for radiating heat generated from the front end section and the logic circuit section mounted on the circuit board are provided in the top face of the housing, and wherein a plurality of inlet holes for taking outside air into an interior of the housing are provided in the bottom face of the housing, and the front end section is mounted on the circuit board at a position near the plurality of exhaust holes provided in the top face of the housing.

According to the above construction, Heat generated from the front end section and the logic circuit section mounted on the circuit board can be radiated efficiently along with an air stream that passes from the bottom face of the housing into the housing interior through the inlet holes and flows upward of the housing through the exhaust holes.

In an embodiment of the present invention, the LED display section is implemented by surface-mounted LED chips and mounting them on the circuit board.

According to this construction, since the front end section, the logic circuit section and the LED display circuit components are mounted and completed onto a substantially single board all by an automatic mounting machine, there is no need of separately preparing the front end section and LED display circuit board and the logic circuit board and thereafter combining the two boards by manual work, which would be involved in the prior art, and neither is there a need of inserting the LED lamp by hand nor, after hand soldering, cutting off leads, so that the assembly process can be omitted. Thus, the production cost can be reduced.

In an embodiment of the present invention, the housing has, inside its front face, a plurality of light guide sections for guiding an optical signal, which designates an operational state, from the plurality of LED chips to the plurality of symbol displays.

According to this construction, since the light guide section fixed to the front panel and the LED chips for the light source are of independent structure, there is no need of positioning the front end portion of the LED lamp to a center portion of the front panel opening, so that the assembly process can be omitted. Thus, the production cost can be reduced.

In order to achieve the other object of the present invention, there is provided a stand for mounting a thin type cable modem which comprises: a circuit board which is a substantially single board on which at least a front end section, a logic circuit section and an LED display section are mounted; and a housing which covers the circuit board and which has a front face, a rear face, a left side face, a right side face, a top face and a bottom face, wherein a plurality of exhaust holes for radiating heat generated from the front end section and the logic circuit section mounted on the circuit board are provided in the top face of the housing, and a plurality of inlet holes for taking outside air into an interior of this housing are provided in the bottom face of the housing, the mounting stand comprising: both side walls; a housing mounting portion; a recessed portion provided in the housing mounting portion so as not to close the plurality of inlet holes provided in the bottom face of the housing; and an engaging portion which is formed in the recessed portion and which is to be engaged with the inlet holes.

According to this construction, since the inlet holes necessary for air ventilation are not closed so that outside air flows into the housing interior, a good heat radiation effect can be obtained. Moreover, the mounting stand allows the thin type cable modem to be stably mounted thereon and, at the same time, serves also as a slide stopper for the cable modem body.

In an embodiment of the present invention, the engaging portion of the mounting stand becomes parallel to the inlet holes so that the inlet holes and the engaging portion are engaged with each other when the bottom face of the housing having the plurality of inlet holes is mounted on the mounting stand, while the engaging portion of the mounting stand becomes non-parallel to the exhaust holes so that the exhaust holes and the engaging portion are not engaged with each other when the top face of the housing having the plurality of exhaust holes is mounted on the mounting stand.

According to this construction, the housing can be prevented from being inversely mounted onto the mounting stand.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 2A to 2E are a front face view, a top face view, a side face view, a bottom face view and a rear face view, respectively, of a thin type cable modem according to an embodiment of the invention;

FIG. 3 is an arrangement diagram of circuit components mounted onto a board inside the housing of a thin type cable modem according to an embodiment of the invention;

FIG. 7 shows the structure of the LED display section of a thin type cable modem according to an embodiment of the invention, where

FIG. 9 shows the positional relation between the thin type cable modem mounting stand and inlet/exhaust holes of the housing according to an embodiment of the invention, where

DETAILED DESCRIPTION OF THE PREFERRED EMBODIMENTS

Figure 1:
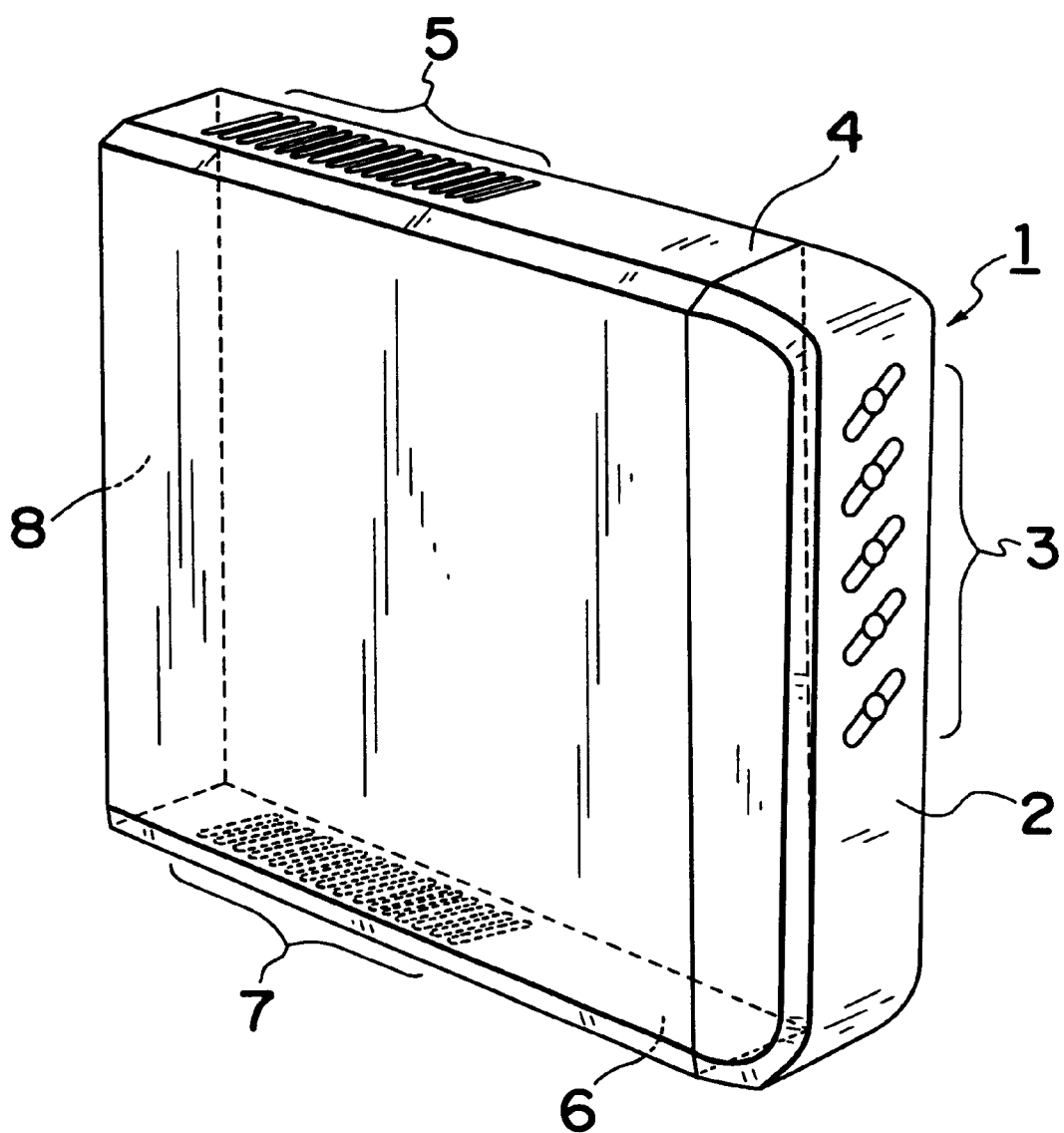
FIG. 1 is an appearance perspective view of a thin type cable modem according to an embodiment of the invention.

A thin type cable modem as well as a stand for mounting the same according to an embodiment of the present invention are described below with reference to the accompanying drawings. FIG. 1 is an appearance perspective view showing a thin type cable modem according to an embodiment of the present invention in conjunction with the appended claims 1 to 3. FIGS. 2A, 2B, 2C, 2D and 2E are a front face view, a top face view, a side face view, a bottom face view and a rear face view, respectively, of the cable modem.

Referring to FIGS. 1 and 2, in a front face 2 of a housing 1, are provided a plurality of symbol displays 3 for indicating operating state of an LED display section. In a top face 4 of the housing are provided a plurality of exhaust holes 5 for radiating heat generated from a front end section and a logic circuit section mounted on a circuit board. Besides, at a bottom face 6 of the housing, there are a plurality of inlet holes 7 for taking outside air into the interior of the housing. Further, to a rear face 8 are connected a power supply cord and various connectors. Outside dimensions of the housing are about 209 mm long×about 35 mm wide×about 170 mm deep.

FIG. 3 is an arrangement diagram of circuit components mounted onto a board 9 in the housing of the cable modem, where numeral 11 denotes the front end section, 12 denotes the logic circuit section, 13 denotes the LED display section and 14 denotes a light guide section. This front end section 11 is mounted on a circuit board 10 located near the plurality of exhaust holes 5 provided in the top face 4 of the housing. In addition, the board 9 is substantially a single circuit board such as a multi-layer circuit board, a double-sided circuit board or other board of various kinds of constitution.

Figure 4:
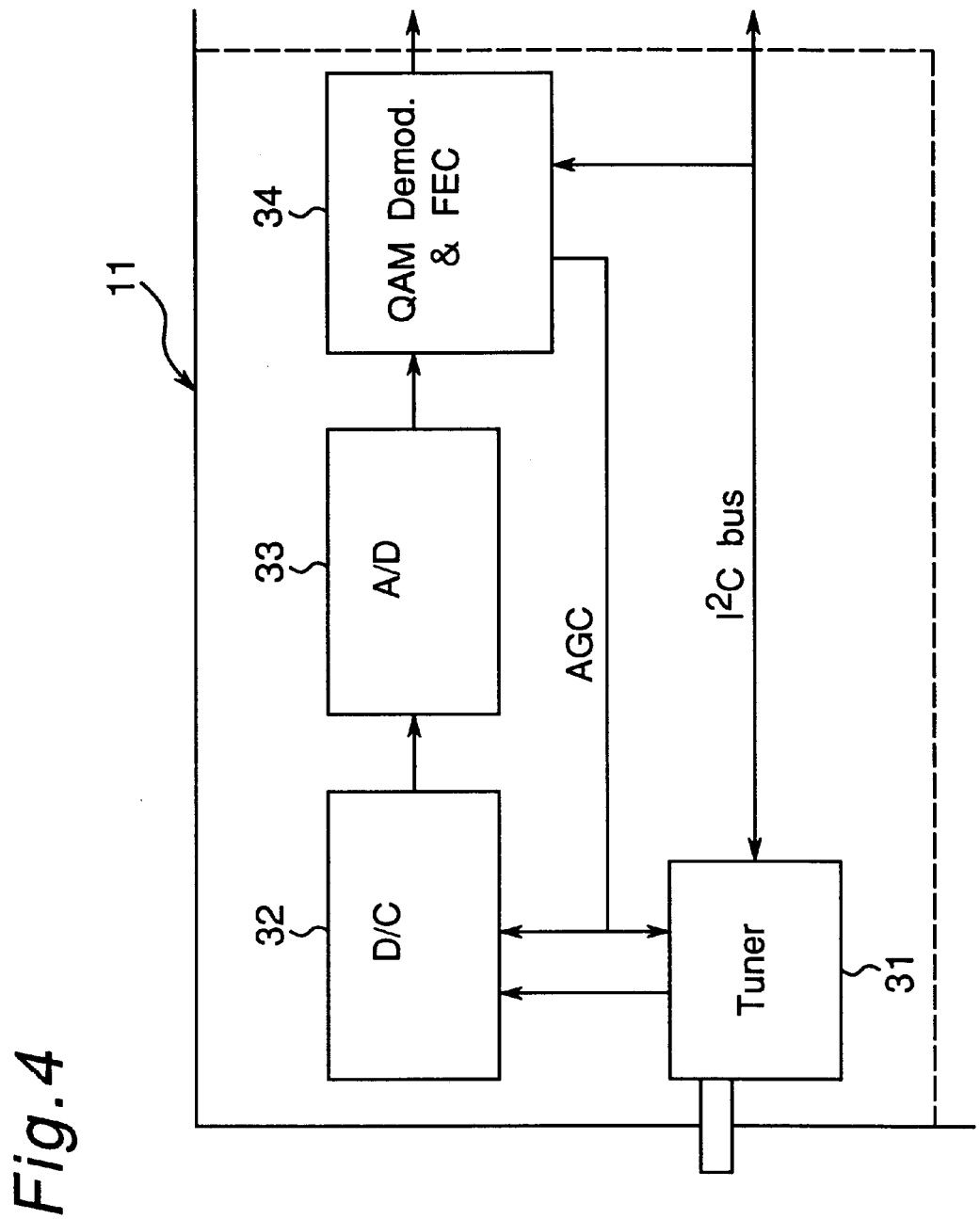
FIG. 4 is a circuit block diagram of the front end section of a thin type cable modem according to an embodiment of the invention.
Figure 5:
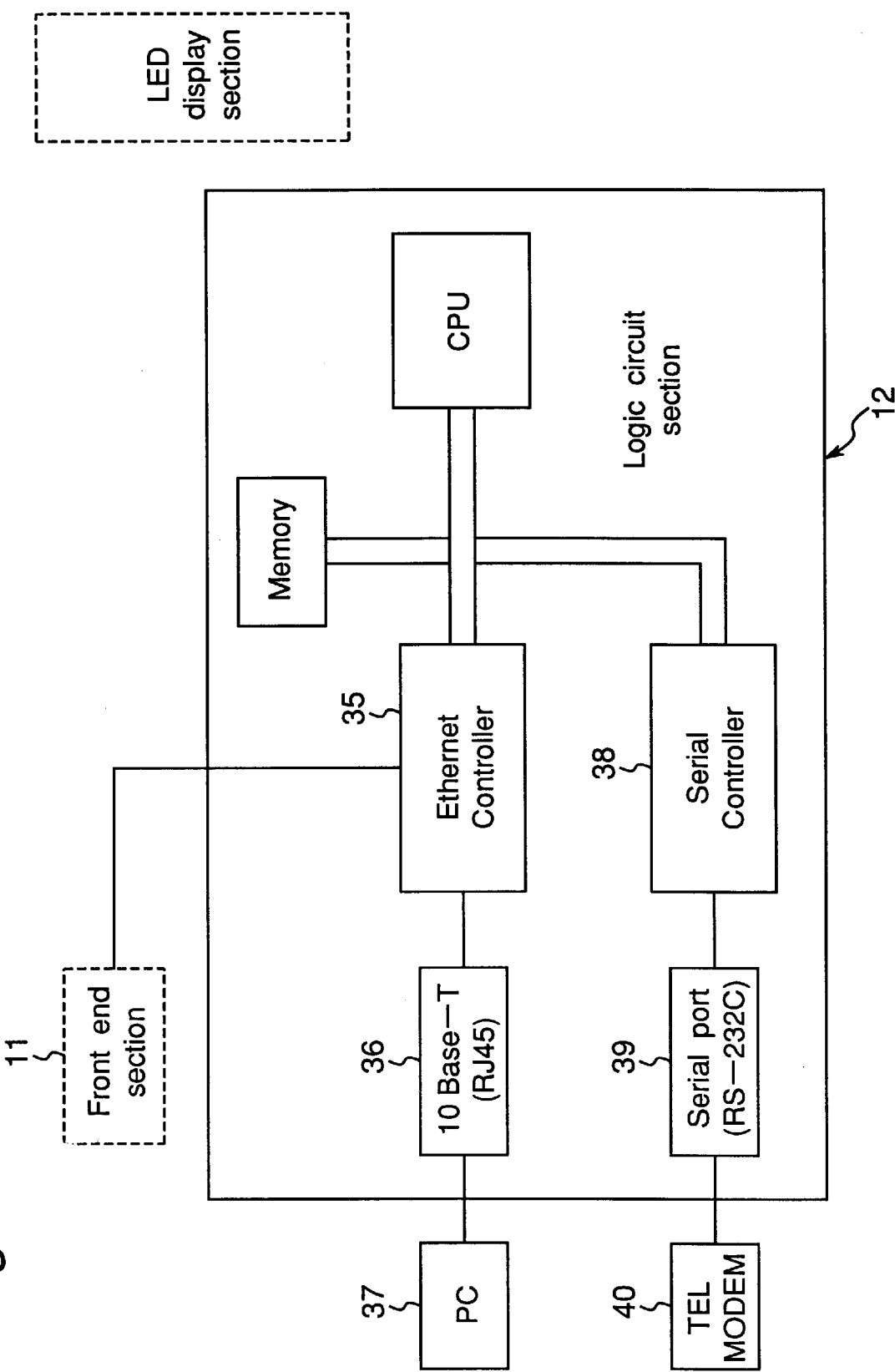
FIG. 5 is a circuit block diagram of the logic circuit section of a thin type cable modem according to an embodiment of the invention.
Figure 6:
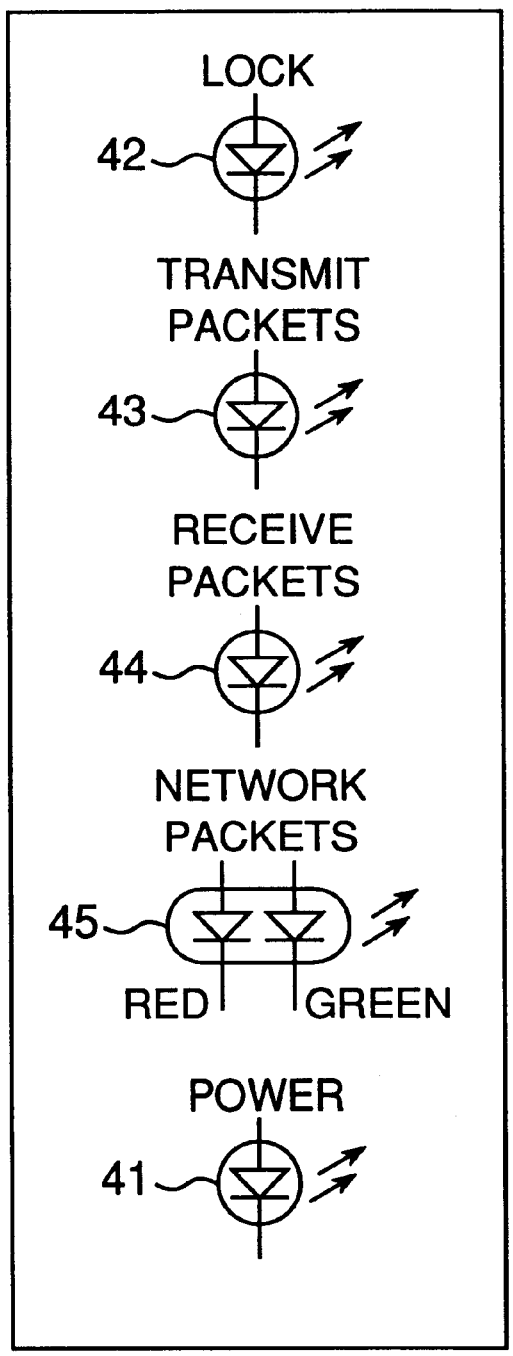
FIG. 6 is a circuit block diagram of the LED display section of a thin type cable modem according to an embodiment of the invention.

FIG. 4 is a circuit block diagram of the front end section, FIG. 5 is a circuit block diagram of the logic circuit section, and FIG. 6 is a circuit block diagram of the LED display section. Operations of the individual circuit blocks are described with reference to the accompanying drawings.

Referring to FIG. 4, in the front end section 11, a desired signal is selected by a tuner 31 from among down RF data signals from a CATV station. An IF signal derived from the tuner is converted into a base band signal by a down converter 32, further converted from analog to digital form by an analog-to-digital converter 33, thereafter demodulated and error-corrected by a 64 QAM (Quadrature Amplitude Modulation) and FEC (Forward Error Correction) 34, and after these steps, led out as a data signal.

Referring to FIG. 5, in the logic circuit section 12, in the case of a down signal, a data signal demodulated by the QAM and led out from the front end section 11 is transmitted to a personal computer 37 via an Ethernet controller 35 and through a 10 Base-T connector 36. In the case of an up signal, conversely, a data signal derived from the personal computer 37 is led out from a serial port 39 via the Ethernet controller 35 and using the DMA (Direct Memory Access) system via a serial controller 38, and thus connected to an external telephone modem 40.

Referring to FIG. 6, in the LED display circuit section, an LED 41 marked as POWER is lit upon power-up, an LED 42 marked as LOCK is lit by occurrence of a clock signal from the front end section, and LEDs 43, 44 marked as TRANSMIT PACKETS, RECEIVE PACKETS are lit upon transmission and reception of a packet signal, respectively. Then, an LED 45 marked as NETWORK PACKETS is lit red during the transmit and reception of packet signals, and green after the transmission and reception of packet signals (at an end of packets).

Next, during the operation, when the individual circuits of the front end section, the logic circuit section and the LED display circuit section are activated, not a few components, particularly those of the front end section and the logic circuit section, would generate a considerable amount of heat. For example, such components are exemplified by the tuner in the front end section, the Ethernet controller and the CPU and the like in the logic circuit section.

Power consumption of the whole cable modem is 5–6 W in the standby state and 10–11 W in the operating state, thus necessitating heat radiation in both standby state and operating state. However, with a view to smaller size and thinner thickness, no cooling fan is attached, and neither is a metallic plate nor metallic chassis or the like for heat radiation provided. First, because much heat is generated in the circuit components (in particular, tuner) of the front end section, the front end section is placed in upper part of the circuit board near the exhaust holes for use of heat radiation while the logic circuit section is placed in lower part of the circuit board, in order to prevent heat accumulation in the housing interior. If the front end section was disposed in lower part of the circuit board, logic circuit components positioned above the front end section would be heated and adversely affected and moreover the whole housing interior would be increased in temperature, which would lead to some malfunction of the circuits.

Also, a chimney effect by making use of air flow is taken into consideration by providing a plurality of inlet holes in the bottom face of the housing. That is, heat released from the front end section and the logic circuit section goes up as it rides on an upward air stream caused by the heat, and is radiated upward of the housing through the plurality of exhaust holes provided in the top face of the housing. This upward air stream causes the internal air pressure to decrease, so that outside air flows into the interior of the housing through the plurality of inlet holes provided in the bottom face of the housing.

The cable modem can be designed for a thin type by making it possible to mount the front end section, the logic circuit section and the LED display circuit components on a single board, which is achieved by miniaturizing the components of the front end section and the logic circuit section and by reducing the parts amount as a result of adopting an FPGA (Field Programmable Gate Array) or ASIC (Application Specific Integrated Circuit) for the logic circuit components, and besides by using a surface-mounted chip LED and further by lowering the noise level to a permissible noise level as a result of separating the power supply line for the tuner, the high-frequency section and the digital section as well as the ground line, and further forming a linear and shortest path for signal flow in the tuner, the high-frequency section and the digital section to thereby optimize the wiring pattern.

Figure 7A:
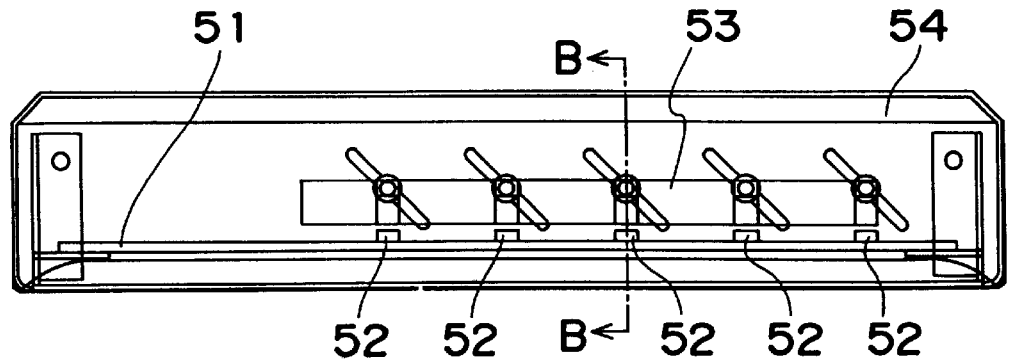
FIG. 7A is a front perspective view and FIG. 7B is a sectional view.
Figure 7B:
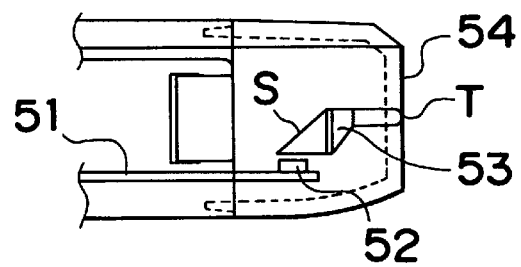

FIG. 7 shows the structure of the LED display section, where FIG. 7A is a front perspective view and FIG. 7B is a sectional view taken along the line B—B of FIG. 7A. Referring to FIG. 7B, light outputted from an LED chip 52 automatically mounted on a circuit board 51 by the surface mount technology becomes incident on a light guide section 53 fixed to a front panel 54, and is reflected by a tilted side face portion S of the light guide section 53, finally reaching an end portion T. Accordingly, the LED display section becomes easier to assemble, as compared with the manual mounting of the LED lamp in the prior art example.

Figure 8:
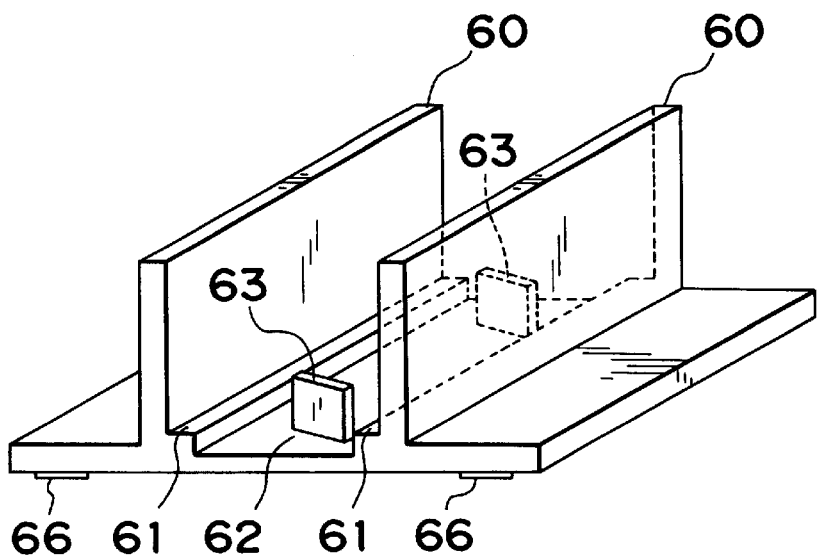
FIG. 8 is a perspective view showing the structure of a stand for mounting a thin type cable modem according to an embodiment of the invention.

FIG. 8 is an appearance perspective view showing the structure of a stand for mounting the thin type cable modem according to the present invention. Reference numeral 60 denotes both side walls, which sandwich the housing of the cable modem therebetween. Numeral 61 denotes a cable modem housing mounting portion, and 62 denotes a recessed portion formed in the housing mounting portion so that the inlet holes in the bottom face of the housing are not closed. Also, numeral 63 denotes an engaging portion which is formed in the recessed portion 62 of the housing mounting portion so as to be engaged with the inlet holes in the bottom face of the housing. Numeral 66 denotes rubber feet for prevention of vibrations and slides. As a result, the mounting stand allows the thin type cable modem to be mounted stably thereon and besides serves as a slide stopper for the cable modem body.

Figure 9A:
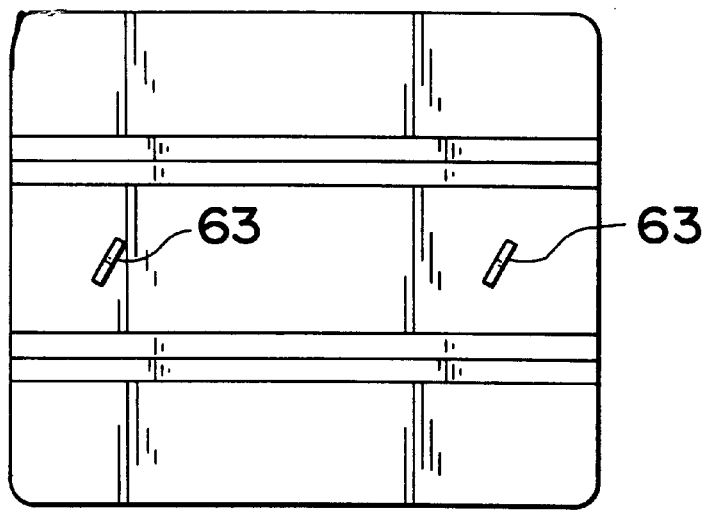
FIG. 9A shows the mounting stand.
Figure 9B:
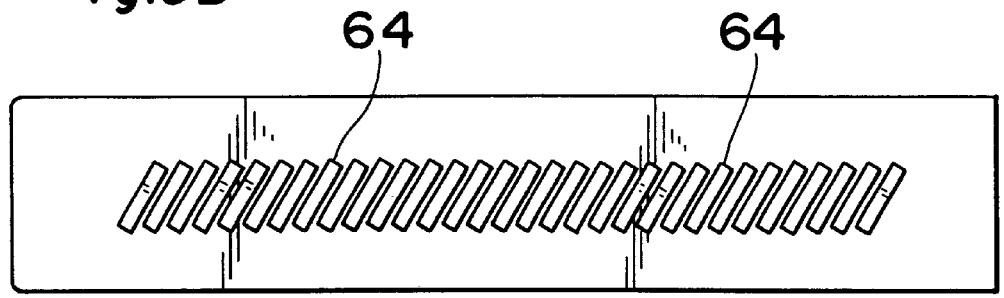
FIG. 9B shows the inlet holes in the bottom face of the housing and FIG. 9C shows exhaust holes in the top face of the housing.
Figure 9C:
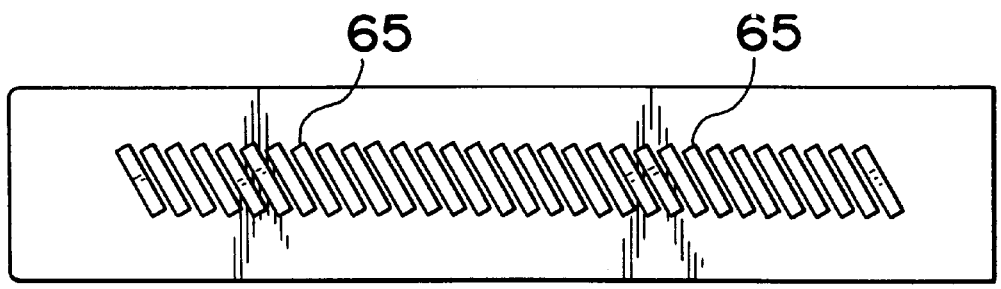
Figure 10:
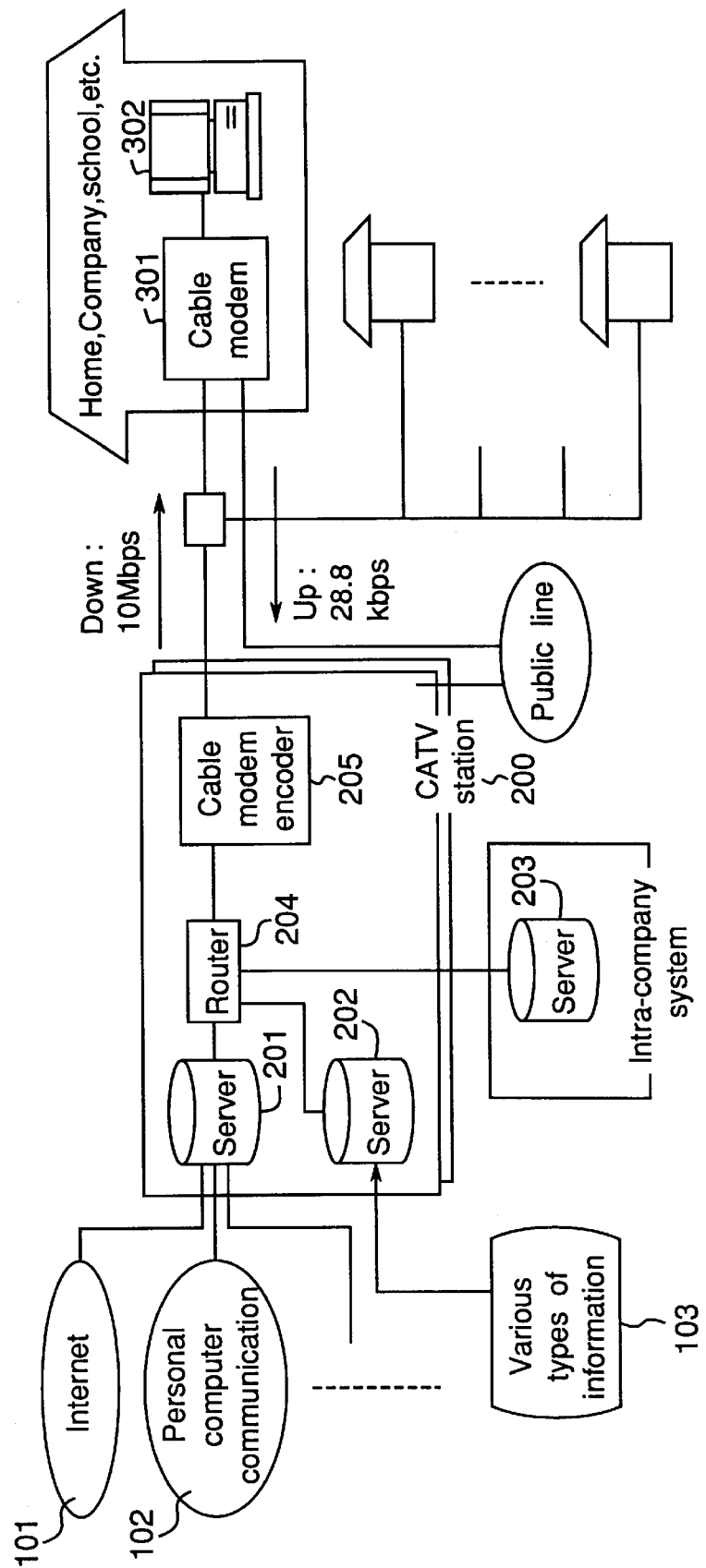
FIG. 10 is a schematic view of a cable modem system according to the prior art.

FIG. 9 shows the positional relation between the mounting stand and the inlet/exhaust holes of the housing when the thin type cable modem of the invention is mounted on the mounting stand, where FIG. 9A shows the mounting stand, FIG. 9B shows the inlet holes in the bottom face of the housing and FIG. 9C shows the exhaust holes in the top face of the housing.

Referring to FIG. 9, in the mounting of the housing of the thin type cable modem onto the mounting stand, when the housing is mounted onto the mounting stand with the bottom face of the housing down as shown in FIG. 9B (normal mounting), the engaging portions 63 of the mounting stand become parallel to the inlet holes 64 of the bottom face of the housing so as to be engaged therewith. Conversely, when the housing is mounted onto the mounting stand with the top face of the housing down as shown in FIG. 9C (inverse mounting), the engaging portions 63 of the mounting stand become non-parallel to the exhaust holes 65 of the top face of the housing so as not to be engaged therewith. Thus, the housing can be prevented from being inversely mounted.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A thin type cable modem comprising:

a circuit board which is a substantially single board on which at least a front end section, a logic circuit section and an LED display section are mounted, wherein the LED display section displays power-on state of the thin type cable modem as well as transmitting and receiving states of a packet signal of the thin type cable modem; and a housing which covers the circuit board and which has a front face, a rear face, a left side face, a right side face, a top face and a bottom face, wherein a plurality of symbol displays for indicating an operational state of the LED display section are provided in the front face of the housing, and a plurality of exhaust holes for radiating heat generated from the front end section and the logic circuit section mounted on the circuit board are provided in the top face of the housing, and wherein a plurality of inlet holes for taking outside air into an interior of the housing are provided in the bottom face of the housing, and the front end section is mounted on the circuit board at a position near the plurality of exhaust holes provided in the top face of the housing.

2. The thin type cable modem according to claim 1, wherein the LED display section is implemented by surface-mounted LED chips mounted on the circuit board.

3. The thin type cable modem according to claim 1, wherein the housing has, inside its front face, a plurality of light guide sections for guiding an optical signal, which designates an operational state, from the plurality of LED chips to the plurality of symbol displays.

4. The thin type cable modem according to claim 1, wherein the substantially single board consists solely as a single board.

5. The thin type cable modem according to claim 1, wherein the heat generating circuit components are located at the front end section adjacent said outlet holes, so that heat flows from the inlet holes to the outlet holes by a chimney effect.

6. The cable modem according to claim 5, wherein the heat flows without a fan.

7. The cable modem according to claim 5, wherein the heat generating circuit components include a tuner.

8. A stand for mounting a thin type cable modem which comprises: a circuit board which is a substantially single board on which at least a front end section, a logic circuit section and an LED display section are mounted; and a housing which covers the circuit board and which has a front face, a rear face, a left side face, a right side face, a top face and a bottom face, wherein a plurality of exhaust holes for radiating heat generated from the front end section and the logic circuit section mounted on the circuit board are provided in the top face of the housing, and a plurality of inlet holes for taking outside air into an interior of the housing are provided in the bottom face of the housing, the mounting stand comprising: both side walls; a housing mounting portion; a recessed portion provided in the housing mounting portion so as not to close the plurality of inlet holes provided in the bottom face of the housing; and an engaging portion which is formed in the recessed portion and which is to be engaged with the inlet holes.

9. The stand for mounting a thin type cable modem according to claim 8, wherein the engaging portion of the mounting stand becomes parallel to the inlet holes so that the inlet holes and the engaging portion are engaged with each other when the bottom face of the housing having the plurality of inlet holes is mounted on the mounting stand, while the engaging portion of the mounting stand becomes non-parallel to the exhaust holes so that the exhaust holes and the engaging portion are not engaged with each other when the top face of the housing having the plurality of exhaust holes is mounted on the mounting stand.

* * * * *